US 6,562,418 B2

(12) United States Patent
Morrow et al.

(10) Patent No.: US 6,562,418 B2
(45) Date of Patent: May 13, 2003

(54) MICROWAVE PROCESSING OF PRESSED BORON POWDERS FOR USE AS CATHODES IN VACUUM ARC SOURCES

(75) Inventors: Marvin S. Morrow, Kingston, TN (US); Donald E. Schechter, Ten Mile, TN (US); Chin-Chi Tsai, Oak Ridge, TN (US); C. Christopher Klepper, Radford, VA (US); John Niemel, Alexandria, VA (US); Robert C. Hazelton, Radford, VA (US)

(73) Assignee: BWXT Y-12 LLC, Oak Ridge, TN (US)

( * ) Notice: Subject to any disclaimer, the term of this patent is extended or adjusted under 35 U.S.C. 154(b) by 0 days.

(21) Appl. No.: 09/855,160

(22) Filed: May 14, 2001

(65) Prior Publication Data
US 2002/0168283 A1 Nov. 14, 2002

(51) Int. Cl.⁷ .............................. B22F 3/12; C23C 4/08
(52) U.S. Cl. .................... 427/580; 427/569; 419/37; 419/38

(58) Field of Search .............. 419/38, 37; 427/475, 427/590, 455, 569, 580

(56) References Cited

U.S. PATENT DOCUMENTS

| 4,342,734 | A |   | 8/1982  | Kumar et al. ............... 423/298 |
|-----------|---|---|---------|-------------------------------------|
| 4,938,673 | A | * | 7/1990  | Adrian ........................ 419/23 |
| 5,252,267 | A | * | 10/1993 | Holcombe et al. ............ 264/26 |
| 5,977,529 | A | * | 11/1999 | Willert-Porada et al. ... 219/698 |
| 6,126,895 | A | * | 10/2000 | Dennis et al. ................. 419/9 |
| 6,183,689 | B1 | * | 2/2001  | Roy et al. ..................... 419/38 |
| 6,239,440 | B1 | * | 5/2001  | Abbott ................... 250/423 R |

OTHER PUBLICATIONS

International Search Report—from International Application No. PCT/US02/15447.

* cited by examiner

Primary Examiner—Daniel J. Jenkins
(74) Attorney, Agent, or Firm—J. Herbert O'Toole; Nexsen Pruet Jacobs & Pollard, LLC

(57) ABSTRACT

Boron powders are sintered and densified utilizing a microwave environment for so doing.

8 Claims, 1 Drawing Sheet

MICROWAVE PROCESSING OF PRESSED BORON POWDERS FOR USE AS CATHODES IN VACUUM ARC SOURCES

The United States Government has rights in this invention pursuant to contract no. DE-AC05-000R22800 between the United States Department of Energy and Lockheed Martin Energy Systems, Inc.

FIELD OF THE INVENTION

This invention relates generally to the art of sintering and more particularly to the art of sintering boron for use as a vacuum arc cathode.

BACKGROUND OF THE INVENTION

Conventionally metals have been applied as thin films by the use of vacuum arc deposition utilizing the desired metal as the cathode. Recently, attempts have been made to extend this technique to non-metals, boron in particular. Conventionally, consolidated boron available for such cathodes has been prepared by hot pressing of boron powders to form a disk which is subsequently used in the cathodic (vacuum) arc evaporation technique. It has been found that such cathodes are extremely short lived because of the severe stresses interposed by this technique.

Vacuum cathodic arc with a boron cathode is of great interest for the production of advanced boron-based thin films. Cathodic arc is a technique employed to grow thin films at very high growth rates, compared to chemical vapor deposition and other physical deposition techniques. In the case of boron-based compounds this deposition can be to increase the wear resistance of a surface e.g., a cutting tool, and, under some conditions, substantially reduce its friction. In other cases the addition of boron can create special electrical properties in semiconductors, for example, silicon and silicon carbide.

The application of this technique to boron has been severely hampered by the poor performance of commercially available boron material for use as cathode due to serious degradation and to breakage during the arcing process.

SUMMARY OF THE INVENTION

It is thus an object of this invention to provide a novel process for forming a sintered boron cathode.

It is a further object of this invention to provide a boron cathode having longer lived operability under conditions of arcing.

It is a further yet more particular object of this invention to provide a unique boron structure not heretofore available in the prior art.

These as well as other objects are accomplished by binding together boron powders and subsequently heating the powders to remove binders and to subsequently sinter and densifiy the boron utilizing a microwave environment for so doing

DETAILED DESCRIPTION

Figure 1:
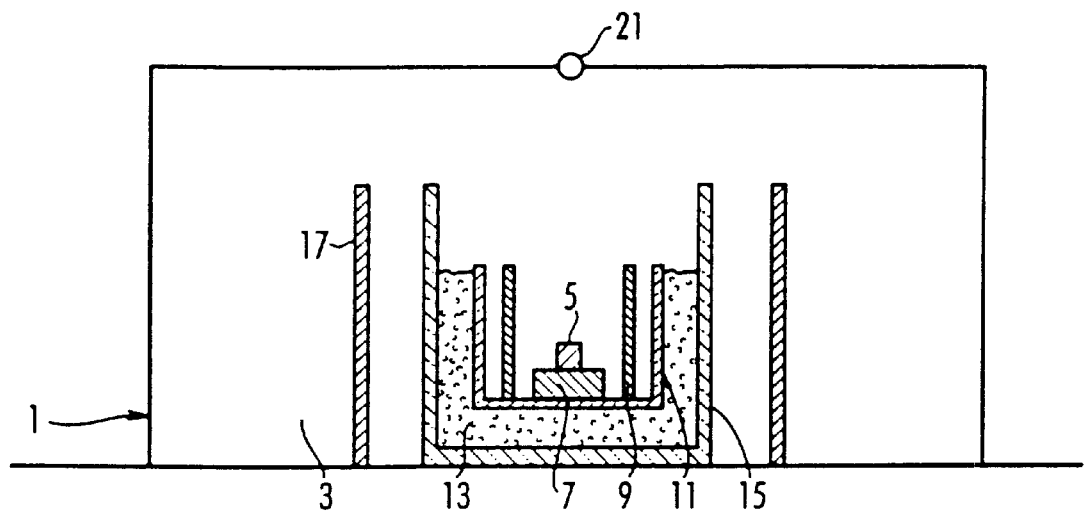
FIG. 1 is a schematic illustration in cross-section of the microwave environment of this invention.

In accordance with this invention it has been found that commercially available boron cathode material is subject to shattering during conditions of arcing. It is believed that the porosity of hot pressed powders is a contributor to this. Even after hot pressing commercially available boron cathode material is typically only 40% dense. Since boron is an intrinsic semi-conductor requiring heating to approximately 800° C. before becoming sufficiently conductive for arcing, it would have been thought that heating would reduce the tendency toward damage during arcing. This would have been thought to be true because most materials are significantly less subject to thermal shock at elevated temperatures. However, experience with testing commercially available boron cathode material has shown that, even at elevated temperatures, shortcomings exist when used in vacuum arc deposition applications due to cracks and other damage caused by local hot spots.

It has been found that the short-comings described above can be overcome by sintering boron utilizing a microwave energy to internally generate heat within the boron. These shortcomings are overcome by the discovery that boron with a higher density makes a better cathode. Various other advantages and features will become apparent from a reading of the following description given with reference to the figure of drawing.

In essence, this invention involves the sintering of boron green disks utilizing microwave energy to internally produce heat within boron. This process provides a boron structure with greatly improved resistance to thermal shock. The material of this invention additionally has a higher density (more than 40%) which results in reduced outgassing during cathode heating. A higher boron density also reduces the erosion rate of the cathode during the arcing process. It is believed that the grain sizes within the resulting sintered structure are substantially smaller than prior art, thus reducing production of macroparticles through fracture process.

Having generally described the invention, the invention will be further understood from the following specific examples.

EXAMPLES

Green formed boron disks were made by dry pressing prepared powder mixtures of pure boron powders and binder powders. In a first run, 160 grams of boron powder were mixed with 6.4 grams of polyvinyl-pyrrolidane binder powders that were present in 240 grams of methanol liquid within a plastic bottle. The bottle was rolled for several hours to improve the mixture uniformity. The mix solution was then dried on a plastic pan at room temperature. The plastic cake of the dried mixture was then screened through a sieve of −325 mesh to prevent conglomeration and yield a prepared powder mix.

Green formed boron disks were then dry pressed using a 20,000 psi mechanical press. The press had a thin coating of wax dissolved in stearic acid to act as a lubricant on the walls of a 1⅛" stainless steel die. Each boron disk was made by loading approximately 7–10 grams of the prepared powder mixture into the die and pressing at 15,000 PSI. These green formed boron disks were then baked at about 600° C. for the removal of binder prior to the sintering process.

FIG. 1 represents the sintering environment. The environment comprises a container 1 defining a microwave cavity 3 for the positioning of a boron disk 5 upon a boron nitride rod 7. Disk 5 and rod 7 are surrounded by a boron nitride tube 9 which is contained within a boron nitride crucible 11. Boron nitride or a boron nitride and glassy carbon mix (13) in the form of a powder insulates the crucible 11 from an outer alumina crucible 15. Further alumina fiberboard insulation 17 provides insulating capacity to prevent heat transmission to the outer walls of the microwave chamber 1.

A window 21 is provided for the measurement of the temperature of the pellet 5. The boron disks so prepared are placed in the position of boron disk 5 within the microwave processing cavity 3. A 24 gigahertz microwave generator was set up to supply approximately 3 kilowatts of power into the microwave processing chamber into which argon was interposed as the sintering atmosphere. Microwaves propagate through the heat shields and crucibles to deposit energy into the boron disk 5. The boron disk was gradually heated to 2000° C. within two hours. It was then slowly raised to the sintering temperature between 2000° C. and 2070° C. in a time period of between 15–90 minutes.

After cooling to room temperature, the sintered boron disks revealed areas of partial sintering and melting. The use of a 24 gigahertz microwave generator provided superior results to a previous experiment utilizing 2.45 gigahertz microwave energy With the use of the lower frequency, the disks tended to have voids resulting from bubble formation.

One of the boron disks prepared from above had a thickness of 0.5 centimeters and a diameter of 2.5 centimeters. This particular disk was sintered at a temperature ranging between 2000° C. and 2070° C. for a period of 90 minutes. The temperature was raised by small increments during the process. The sintering process was terminated when arcing occurred in the microwave applicator. This sintered disk showed severe shrinkage with cracks. The bottom side of the boron disks on the boron nitride rod was slightly melted.

Another boron disk having a thickness of 0.94 centimeters and a diameter of 2.84 centimeters was sintered also within the range of 2000° C. to 2070° C. for 15 minutes. Again, the sintering process was terminated when arcing occurred in the microwave applicator. This disk showed only a small amount of shrinkage indicating poor densification. However, the density of this disk was found to be approximately 60%.

Figure 2:
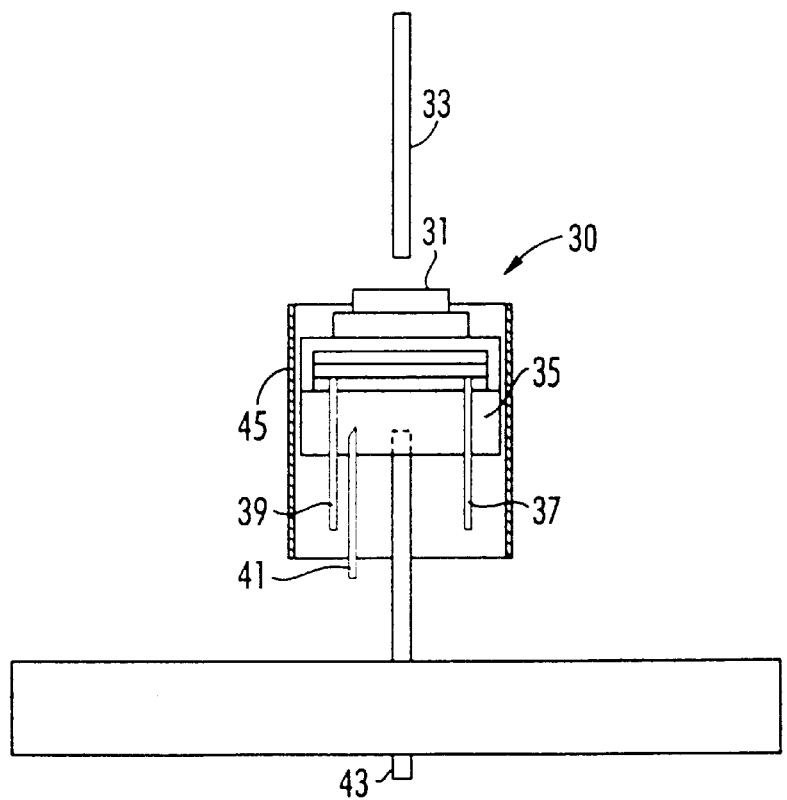
FIG. 2 schematically illustrates the anode/trigger-cathode arrangement used in testing this invention.

FIG. 2 of the drawings illustrates the vacuum arc assembly 30, with disk 31 being the boron cathode of this invention, closely associated with a tungsten anode 33 manually moveable toward and away from disk 31. Disk 31 is mounted upon a graphite heater assembly 35 having electrical terminals 37 and 39 associated therewith. The positive terminal of a power supply (not shown) is attached to the tungsten anode 33 and the negative terminal of the power supply is attached to the graphite heater 35 which is electrically conductive with the disk 31. A thermocouple 41 measures the temperature of the heater assembly. The heater assembly rests upon a feed-through cathode pin 43. The entire heater and cathode assembly is shielded by a tantalum shield 45.

The 0.94 disk was operated in the vacuum arc assembly 30 of FIG. 2. Once the cathode temperature exceeded 800° C., the resistive heater connection was removed and the tungsten anode rod 33 was manually moved into contact with the boron disk 31 which was at that point sufficiently conductive. The current produced in this way in the arc power supply further heated the boron disk. An arc was established by pulling back the anode 33. Several DC arc events were maintained at 30 volts, 25–30 amps, for 30–60 seconds, producing a directed boron plasma which would condense on an appropriate substrate in its path to form a boron-based film. Under vacuum arc events this microwave process boron disk survived, but regular hot press powder boron disks did not. The hot pressed disks were either cracked upon initiation of the arc or eroded by the arc with a hole through the disk.

It was thus found that even partial densification of the pressed boron by microwave power significantly reduces the damaging effects of thermal stress induced by arcing.

Alternatives in the above process may include the use of a vacuum as opposed to an inert gas during sintering, as well as the use of a partial oxygen atmosphere so as to reduce any residual carbon from binder material.

It is thus seen that the process of this invention provides a novel sintered article having properties which lend to longer lived existence under conditions of cathodic arcing. As the above description is exemplary in nature many variations will become apparent to those skilled in the art from a reading thereof. However, such variations are within the spirit and scope of this invention as defined by the following appended claims.

What is claimed:

1. A process for sintering boron comprising the steps of:
   dry pressing powders of boron and a binder to form a disk;
   baking said disk at a temperature sufficient to remove the binder therefrom; and
   sintering said disk at essentially atmospheric pressure in the cavity of a microwave furnace using a generator operating at about 24 GHz to a temperature between 2000° C. and 2070° C. for a period of 15 to 90 minutes.

2. The process according to claim 1, comprising prior to said step of dry pressing, mixing said boron and binders with alcohol.

3. The process according to claim 1, wherein said microwave generator has a variable power level.

4. The process according to claim 1 wherein the sintering atmosphere is an inert gas.

5. The process according to claim 1 wherein said temperature of baking is 600° C. or lower.

6. A process for providing a vacuum arc deposition of boron comprising the steps of:
   dry pressing powders of boron and a binder to form a disk;
   baking said disk at a temperature sufficient to remove the binder therefrom; and
   sintering said disk at essentially atmospheric pressure in the cavity of a microwave furnace using a generator operating at about 24 GHz to a temperature between 2000° C. and 2070° C. for a period of 15 to 90 minutes.
   cooling said disk to room temperature;
   attaching said disk to a heater assembly to form a heated cathode assembly;
   heating said disk to a temperature of about 700° C.;
   bringing said boron disk into contact with an anode;
   establishing an arc between said boron disk and said anode to produce a boron plasma.

7. The process according to claim 6 wherein said step of heating said discs heats said disc to a temperature of at least 700° C.

8. The process according to claim 6 wherein said microwave environment is provided from a 24 gigahertz microwave generator has a variable power output.

* * * * *